US 9,082,929 B2

(12) United States Patent
Kwon et al.

(10) Patent No.: US 9,082,929 B2
(45) Date of Patent: Jul. 14, 2015

(54) LIGHT EMITTING DEVICE AND LIGHT EMITTING DEVICE PACKAGE

(71) Applicant: LG INNOTEK CO., LTD., Seoul (KR)

(72) Inventors: Oh Min Kwon, Seoul (KR); Jong Hak Won, Seoul (KR); Kwang Sun Baek, Seoul (KR); Heon Jin Seo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 147 days.

(21) Appl. No.: 13/829,479

(22) Filed: Mar. 14, 2013

(65) Prior Publication Data

US 2013/0328056 A1    Dec. 12, 2013

(30) Foreign Application Priority Data

Jun. 7, 2012 (KR) .................. 10-2012-0060751

(51) Int. Cl.
    *H01L 33/32* (2010.01)
    *H01L 33/12* (2010.01)
    *H01L 33/58* (2010.01)

(52) U.S. Cl.
    CPC ............... *H01L 33/32* (2013.01); *H01L 33/12* (2013.01); *H01L 33/58* (2013.01)

(58) Field of Classification Search
    CPC .......... H01L 33/06; H01L 33/24; H01L 33/32
    USPC ................................. 257/15, 14, 76
    See application file for complete search history.

(56) References Cited

U.S. PATENT DOCUMENTS

| 6,084,899 A * | 7/2000 | Shakuda ............... 372/45.01 |
| 6,229,834 B1 * | 5/2001 | Nisitani et al. ....... 372/45.01 |
| 6,838,693 B2 * | 1/2005 | Kozaki ..................... 257/14 |
| 8,647,904 B2 * | 2/2014 | Araki et al. ............... 438/46 |
| 2009/0072262 A1 * | 3/2009 | Iza et al. ................... 257/98 |

* cited by examiner

Primary Examiner — Stephen W Smoot
Assistant Examiner — Edward Chin
(74) Attorney, Agent, or Firm — Birch, Stewart, Kolasch & Birch, LLP

(57) ABSTRACT

Disclosed is a light emitting device including a substrate, a buffer layer on the substrate, and a light-emitting structure on the buffer layer. The buffer layer has a refractive index decreased toward the substrate from the light-emitting structure.

20 Claims, 14 Drawing Sheets

100A

100B

LIGHT EMITTING DEVICE AND LIGHT EMITTING DEVICE PACKAGE

The present application claims priority under 35 U.S.C. §119(a) of Korean Patent Application No. 10-2012-0060751 filed on Jun. 7, 2012, which is hereby incorporated by reference in its entirety.

BACKGROUND

The embodiment relates to a light emitting device.
The embodiment relates to a light emitting device package.
Light emitting diodes (LEDs) are semiconductor light emitting devices to convert current into light.
Since the light emitting devices can obtain light having high brightness, the light emitting devices have been extensively used as light sources for displays, vehicles, and lightings.
The light emitting devices can express white light representing superior light efficiency and superior color reproduction through the combination of LEDs including various phosphors and expressing various colors. The light emitting devices expressing the white light may be used in the various fields such as lighting, display, and vehicle fields.
The light emitting devices are widely utilized in the form of a light emitting device package for the purpose of optimizing light efficiency, heat radiation performance, and handling.

SUMMARY

The embodiment provides a light emitting device capable of expanding an orientation angle.
The embodiment provides a light emitting device package capable of increasing optical power.
According to the embodiment, there is provided a light emitting device including a substrate, a buffer layer on the substrate, and a light-emitting structure on the buffer layer. The refractive index of the buffer layer is decreased toward the substrate from the light-emitting structure.
According to the embodiment, there is provided a light emitting device including a substrate, a buffer layer on the substrate, and a conductive semiconductor layer on the buffer layer. The buffer layer includes a plurality of sub-layers, and the refractive index of each sub-layer is decreased toward the substrate from the light-emitting structure.

DETAILED DESCRIPTION OF THE EMBODIMENTS

Figure 1:
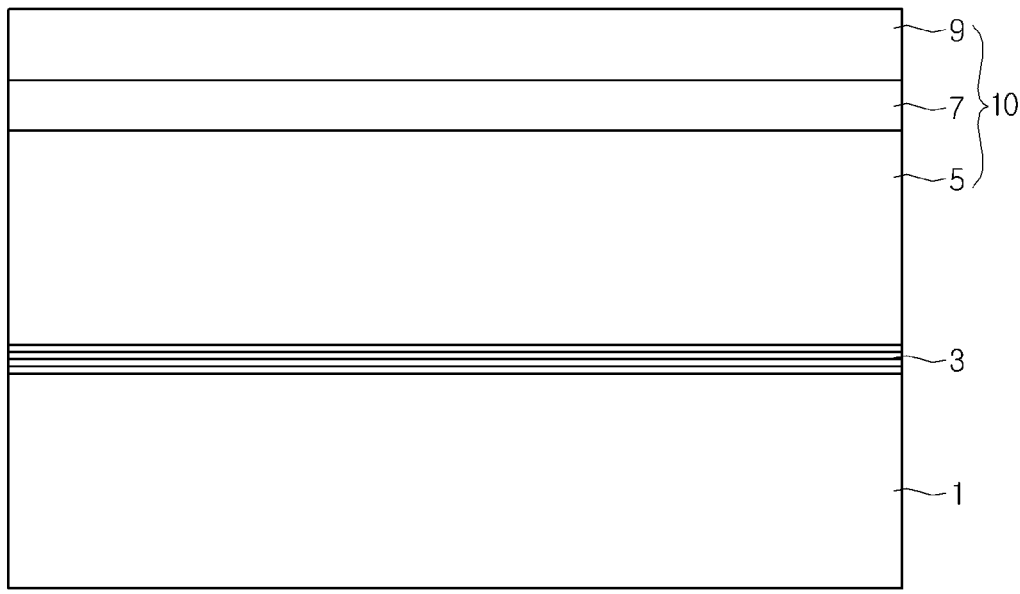
FIG. 1 is a sectional view showing a light emitting device according to a first embodiment.

In the following description of the embodiments, it will be understood that, when a layer (film), a region, a pattern or a structure is referred to as being "on" or "under" another layer (film), region, pattern or structure, it can be "directly" or "indirectly" on the other layer (film), region, pattern or structure, or one or more intervening layers may also be present. Such a position of each layer described with reference to the drawings.

Hereinafter, the embodiment will be described with reference to accompanying drawings. The thickness and size of each layer shown in the drawings may be exaggerated, omitted or schematically drawn for the purpose of convenience or clarity. In addition, the size of each layer does not utterly reflect an actual size.

FIG. 1 is a sectional view showing a light emitting device according to a first embodiment.

Referring to FIG. 1, a light emitting device 100A according to the first embodiment may include a substrate 1, a buffer layer 3, and a light-emitting structure 10.

The substrate 1 may serve as a member to grow the light-emitting structure 10, but the embodiment is not limited thereto.

In order to stably grow the light-emitting structure 10, the substrate 1 may include a material that makes a smaller lattice constant difference from that of the light-emitting structure 10.

The substrate 1 may include at least one selected from the group consisting of $Al_2O_3$, SiC, Si, GaAs, GaN, ZnO, Si, GaP, InP and Ge.

The buffer layer 3 may be interposed between the substrate 1 and the light-emitting structure 10. The buffer layer 3 may be formed to reduce the lattice constant difference between the substrate 1 and the light-emitting structure 10. For example, the lattice constant of the buffer layer 3 may have an intermediate value between the substrate 1 and the light-emitting structure 10, but the embodiment is not limited thereto.

Therefore, due to the buffer layer 3, the light-emitting structure 10 formed on the buffer layer 3 represents superior crystalline, strain is prevented, and the failure such as lattice defects is removed. Accordingly, as well as the electrical characteristic of the light emitting device 100A, the optical characteristic of the light emitting device 100A can be improved.

The buffer layer 3 and the light-emitting structure 10 may include a group II-VI compound semiconductor material or a group III-V compound semiconductor material.

For example, the light-emitting structure 10 may include a first conductive semiconductor layer 5, an active layer 7, and a second conductive semiconductor layer 9, but the embodiment is not limited thereto. The first conductive semiconductor layer 5 may be formed on the buffer layer 3, the active layer 7 may be formed on the first conductive semiconductor layer 5, and the second conductive semiconductor layer 9 may be formed on the active layer 7.

For instance, the first conductive semiconductor layer 5 may include an N type semiconductor layer that includes N type dopants. The first conductive semiconductor layer 5 may be formed of a semiconductor material having a composite formula of $In_xAl_yGa_{1-x-y}N$ ($0≤x≤1$, $0≤y≤1$, and $0≤x+y≤1$), e.g., at least one of InAlGaN, GaN, AlGaN, AlInN, InGaN, AlN, or InN, but the embodiment is not limited thereto. The N type dopants may include one selected from the group consisting of Si, Ge, and Sn, but the embodiment is not limited thereto.

The active layer 7 may be formed on the first conductive semiconductor layer 5.

The active layer 7 is a layer in which first carriers (e.g., electrons) injected through the first conductive semiconductor layer 5 are combined with second carriers (e.g., holes) injected through the second conductive semiconductor layer 9 to emit light having the wavelength corresponding to the difference of an energy band gap depending on a material which constitutes the active layer 7.

The active layer 7 may include one of a single quantum well structure, a multi quantum well (MQW) structure, a quantum dot structure, or a quantum wire structure. The active layer 7 may have the stack structure in which a cycle of well and barrier layers including group II-VI compound semiconductors or III-V compound semiconductors are repeatedly formed.

The active layer 7 may be formed of a compound semiconductor material having a composite formula of $In_xAl_yGa_{1-x-y}N$ ($0≤x≤1$, $0≤y≤1$, and $0<x+y<1$). For instance, the active layer 7 may be formed in the stack structure of InGaN/GaN, InGaN/AlGaN, InGaN/InGaN. The band gap of the barrier layer may be greater than the bandgap of the well layer.

The second conductive semiconductor layer 9 may be formed on the active layer 7. For instance, the second conductive semiconductor layer 9 may include a P type semiconductor layer that includes P type dopants. The second conductive semiconductor layer 9 may be formed of a semiconductor material having a composite formula of $In_xAl_yGa_{1-x-y}N$ ($0≤x≤1$, $0≤y≤1$, and $0≤x+y≤1$). The second conductive semiconductor layer 9 may include at least one of InAlGaN, GaN, AlGaN, InGaN, AlN, InN and AlInN, but the embodiment is not limited thereto. The P type dopants may include one selected from the group consisting of Mg, Zn, Ca, Sr, and Ba, but the embodiment is not limited thereto.

As described above, the buffer layer 3 may reduce the lattice constant difference between the substrate 1 and the light-emitting structure 10.

In addition, the buffer layer 3 may output light, which is generated from the active layer 7 and directed toward the buffer layer 3, while more widely spreading the light.

In this case, that the light is output while more widely spreading the light refers to that an orientation angle of the light is enlarged. For example, if the orientation angle is changed from 100° to 120°, the orientation angle is more enlarged by 20°.

The orientation angle is an angle to represent the spreading degree of light. Accordingly, the orientation angle may refer to the whole angle in which the light is spread rightward and leftward with respect to a normal line.

In order for a light emitting device to be used as a light source of a display, it is preferred that the orientation angle approximates the maximum angle (e.g.,) 180°. In other words, if the orientation is narrow, the light may be concentratedly output around the normal line. The light source of the display may be constructed by aligning a plurality of light emitting devices in a line with each other under a display panel. If orientation angles of the light emitting devices are narrow, light having greater brightness is irradiated into a first region of the display panel corresponding to the light emitting devices, and light having less brightness is irradiated into a second region of the display panel corresponding to a region between the light emitting devices. Accordingly, the uniform brightness may not be obtained according to the position of the light incident onto the display panel, which causes the fatal defect such as the irregularity of image quality.

The light emitting device 100A according to the first embodiment can adjust an external light extraction (e.g., the orientation angle of the external light extraction) by adjusting the optical characteristics (e.g., refractive index) of the buffer layer 3 provided in the light emitting device 100A instead of an external package stage.

The buffer layer 3 according to the first embodiment can expand the orientation angle of the light generated from the active layer 7 and directed toward the buffer layer 3, so that the uniform brightness can be obtained throughout the whole region of the display panel when the light is adopted as a display light source.

To this end, the buffer layer 3 may be formed in such a manner that the refractive index of the light is decreased from a first region adjacent to the light-emitting structure 10 toward a second region adjacent to the substrate 1. The first and second regions each may include a plurality of sub-layers, but the embodiment is not limited thereto.

Figure 10A:
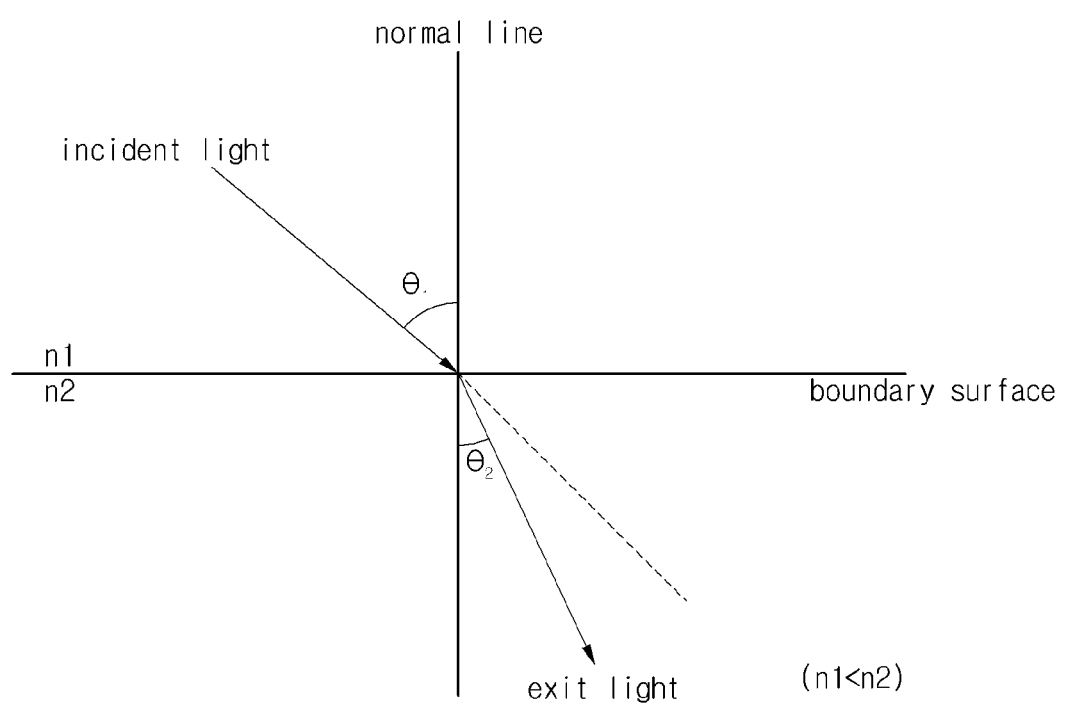
FIGS. 10a and 10b are graphs showing the traveling path of light as a function of a refractive index.

For instance, as shown in FIG. 10a, on the assumption that the refractive index of a first layer is n1, the refractive index of a second layer is n2, and n1 and n2 have the relationship equation of n1<n2 therebetween, when incident light having an incidence angle θ1 with respect to a normal line reach the boundary surface between the first and second layers, the incident light may be output as an exit light having an exit angle of θ2 with respect to the normal line at the boundary surface between the first and second layers. In this case, the exit angle of θ2 may be smaller than the incidence angle of θ1.

In other words, if the refractive index (n2) of the second layer, through which the light is output, is greater than the refractive index (n1) of the first layer into which the light is incident, the light is output with the exit angle (θ2) smaller than the incidence angle (θ1).

Figure 10B:
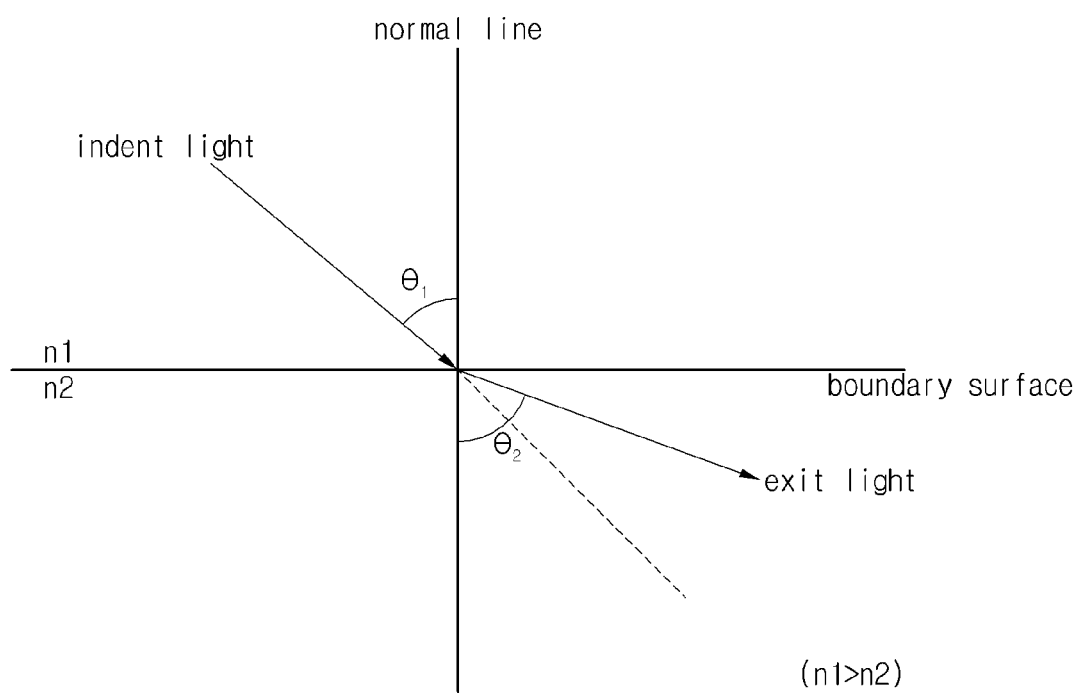

For instance, as shown in FIG. 10b, on the assumption that the refractive index of the first layer is n1, the refractive index of the second layer is n2, and n1 and n2 have the relationship equation of n1>n2 therebetween, when incident light having the incidence angle θ1 with respect to the normal line reach the boundary surface between the first and second layers, the incident light may be output as an exit light having the exit angle of θ2 with respect to the normal line at the boundary surface between the first and second layers. In this case, the exit angle of θ2 may be greater than the incidence angle of θ1.

In other words, if the refractive index (n1) of the first layer, into which the light is incident, is greater than the refractive index (n2) of the second layer through which the light is output, the light is output with the exit angle (θ2) greater than the incidence angle (θ1).

Therefore, according to the first embodiment, the refractive index is decreased from the first region of the buffer layer 3 adjacent to the light-emitting structure 10 to the second region of the buffer layer 3 adjacent to the substrate 1, so that the light generated from the active layer 7 and directed toward the buffer layer 3 is more widely spread while being incident onto the substrate 1. As described above, as the light more widely spread by the buffer layer 3 is output, the orientation angle of the light is expanded, so that the optical power can be increased.

FIGS. 3 to 9 show graphs according to various embodiments in which the refractive index of light in the buffer layer 3 is more decreased from the first region adjacent to the light-emitting structure 10 toward second region adjacent to the substrate 1.

Figure 3:
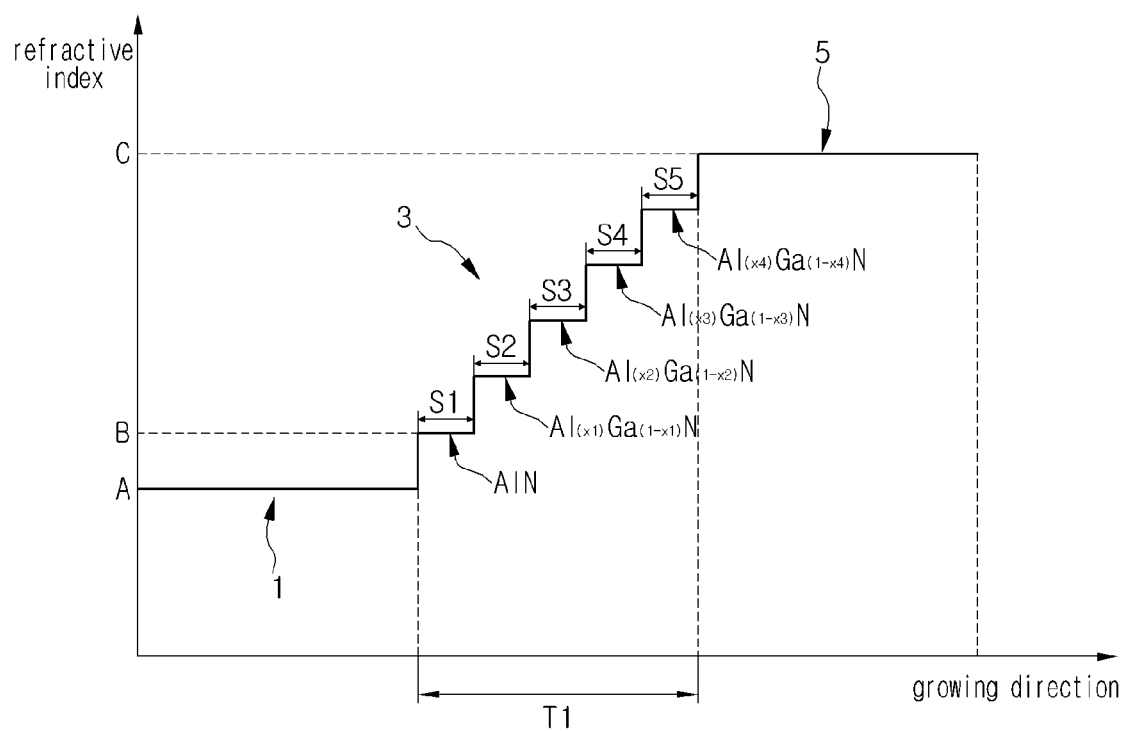
FIG. 3 is a graph showing a first example of the refractive index distribution of a buffer layer according to the first and second embodiments.

As shown in the first example of FIG. 3, the buffer layer 3 may include a plurality of sub-layers having refractive indexes different from each other. The sub-layers have the same thickness S1 to S5, but the embodiment is not limited thereto. The total thickness of the buffer layer 3 may be defined as "T1".

Although FIG. 3 shows the buffer layer 3 including five sub-layers, the embodiment is not limited thereto.

For example, the buffer layers 3 may include 2 to 30 sub-layers. In order to prepare a plurality of sub-layers, at least two sub-layers is required. In addition, if 30 sub-layers are provided, the buffer layer 30 has the thickness comparatively increased, so that the thickness of the light emitting device may also be increased.

As shown in FIG. 3, the refractive index A of the substrate 1 may be 1.77, and the refractive index C of the light-emitting structure 10 may be 2.43, but the embodiment is not limited thereto. For example, the substrate 1 may include sapphire and the first conductive semiconductor layer 5 of the light-emitting structure 10 may include GaN.

Accordingly, the buffer layer 3 may have the refractive index greater than that of the substrate 1 and smaller than that of the light-emitting structure 10.

Aluminum nitride (AlN) may be a group III-V compound semiconductor material having the refractive index in the range of the refractive index A (1.77) and the refractive index C (2.43). However, the embodiment is not limited thereto. In addition, the refractive index B of AlN may be 2.15.

Therefore, the buffer layer 3 may include a group III-V compound semiconductor material having a composite formula of $Al_xGa_{(1-x)}N$ ($0 \leq x \leq 1$). For example, if x=0, the buffer layer 3 may include gallium nitride (GaN), and, if x=1, the buffer layer 3 may include aluminum nitride (AlN).

The buffer layer 3 may include aluminum nitride (AlN), aluminum gallium nitride (AlGaN), and gallium nitride (GaN) in a direction of the thickness between the substrate 1 and the first conductive semiconductor layer 5 from the substrate 1.

For example, a first portion of the buffer layer 3 adjacent to the substrate 1 includes AlN. A second portion of the buffer layer 3 includes AlGaN, and a third portion of the buffer layer 3 may include GaN.

Meanwhile, the buffer layer 3 may include a group III-V compound semiconductor material having the composite formula of $Al_xGa_{(1-x)}N$ ($0 \leq x \leq 1$). In this case, the buffer layer 3 includes AlN and AlGaN, and does not include GaN.

The Al content of the buffer layer 3 may be adjusted in such a manner that the Al content of the buffer layer 3 is varied in the direction of the thickness between the substrate 1 and the first conductive semiconductor layer 5 from the substrate 1. In other words, the Al content may be maximized in the first region of the buffer layer 3 adjacent to the substrate 1, and decreased toward the light-emitting structure 10 from the first region.

For example, a first sub-layer including AlN having the maximum Al content (x=1) may be formed.

In adjacent to the first sub-layer, a second sub-layer including $Al(x1)Ga(1-x1)N$ having the Al content of x1 may be formed. x1 may be smaller than 1, but the embodiment is not limited thereto.

In adjacent to the second sub-layer, a third sub-layer including $Al_{(x2)}Ga_{(1-x2)}N$ having the Al content decreased to x2 may be formed. In this case, x2 may be smaller than x1.

In adjacent to the third sub-layer, a fourth sub-layer including $Al_{(x3)}Ga_{(1-x3)}N$ having the Al content decreased to x3 may be formed. In this case, x3 may be smaller than x2.

In adjacent to the fourth sub-layer, a fifth sub-layer including $Al_{(x4)}Ga_{(1-x4)}N$ having the Al content decreased to x4 may be formed. In this case, x4 may be smaller than x3.

As shown in the first example of FIG. 3, the difference in the refractive index between the first to fifth sub-layers may be constant. The uniform difference in the refractive index may be obtained by making the decrease width of the Al content uniform.

The difference in the refractive index between the sub-layers adjacent to each other may be determined depending on the decrease width of the Al content. Accordingly, in order to uniformly make the difference in the refractive index among the first to fifth sub-layers, the decrease width of the Al content must be uniformly made.

The refractive index may be increased from the first sub-layer to the fifth sub-layer while making the uniform difference in the refractive index among the first to fifth sub-layers.

As the Al content is decreased, the refractive index may be increased.

For example, as shown in FIG. 3, since the refractive index C of GaN is 2.43, and the refractive index B of AlN is 2.15, the difference in the refractive index between GaN and AlN is 0.28.

For example, if the buffer layer 3 includes five sub-layers, the uniform refractive index difference (0.28/5=0.056) may be made between individual sub-layers.

In other words, the second sub-layer may have the refractive index of 2.206 which is 0.056 higher than that of the refractive index of the first sub-layer including AlN. The third sub-layer may have the refractive index of 2.262 which is 0.056 higher than that of the second sub-layer. The fourth sub-layer may have the refractive index of 2.318 which is 0.056 higher than that of the refractive index of the third sub-layer. The fifth sub-layer may have the refractive index of 2.374 which is 0.056 higher than that of the fourth sub-layer. The first conductive semiconductor layer 5 including GaN may have the refractive index C of 2.43 which is 0.056 higher than that of the fifth sub-layer.

The refractive index of GaN may be greater than that of the fifth sub-layer of the buffer layer 3, and the refractive index of the fifth sub-layer may be greater than that of the fourth sub-layer. The refractive index of the fourth sub-layer may be greater than that of the third sub-layer, and the refractive index of the third sub-layer may be greater than that of the second sub-layer. The refractive index of the second sub-layer may be greater than that of the first sub-layer.

Meanwhile, the difference in the refractive index between the individual sub-layers may be increased or decreased from the first sub-layer toward the fifth sub-layer, but the embodiment is not limited thereto. The refractive index difference may be linearly or non-linearly increased or decreased.

The light generated from the active layer 7 may be directed toward the first conductive semiconductor layer 5. Since the refractive index of the first conductive semiconductor layer 5 is greater than that of the fifth sub-layer of the buffer layer 3, the light directed toward the first conductive semiconductor layer 5 may be output as light having an exit angle greater than an incidence angle with respect to a normal line to a first boundary surface between the first conductive semiconductor layer 5 and the fifth sub-layer. In other words, the light output from the first boundary surface may be more widely spread with the exit angle greater than the incidence angle of the light incident into the first boundary surface.

Since the refractive index of the fifth sub-layer is greater than that of the fourth sub-layer, the light directed toward the fifth sub-layer may be output as light having an exit angle greater than an incidence angle with respect to a normal line to a second boundary surface between the fifth sub-layer and the fourth sub-layer. In other words, the light output from second first boundary surface may be more widely spread with the exit angle greater than the incidence angle of the light incident into the second boundary surface.

Since the refractive index of the fourth sub-layer is greater than that of the third sub-layer, the light directed toward the fourth sub-layer may be output as light having an exit angle greater than an incidence angle with respect to a normal line to a third boundary surface between the fourth and third sub-layers. In other words, the light output from the third boundary surface may be more and more widely spread with the exit angle greater than the incidence angle of the light incident into the third boundary surface.

Since the refractive index of the third sub-layer is greater than that of the second sub-layer, the light directed toward the third sub-layer may be output as light having an exit angle greater than an incidence angle with respect to a normal line to a fourth boundary surface between the third and second sub-layers. In other words, the light output from the fourth boundary surface may be more and more widely spread with the exit angle greater than the incidence angle of the light incident into the fourth boundary surface.

Since the refractive index of the second sub-layer is greater than that of the first sub-layer, the light directed toward the second sub-layer may be output as light having an exit angle greater than an incidence angle with respect to a normal line to a fifth boundary surface between the second and first sub-layers. In other words, the light output from the fifth boundary surface may be more and more widely spread with the exit angle greater than the incidence angle of the light incident into the fifth boundary surface.

Since the refractive index of the first sub-layer is greater than that of the substrate 1, the light directed toward the first sub-layer may be output as light having an exit angle greater than an incidence angle with respect to a normal line to a sixth boundary surface between the first sub-layer and the substrate 1. In other words, the light output from the sixth boundary surface may be more and more widely spread with the exit angle greater than the incidence angle of the light incident into the sixth boundary surface.

As described above, since the light is more widely output at each boundary surface between the individual sub-layers of the buffer layer 3, the spreading degree of the light may be more increased throughout the whole thickness T1 of the buffer layer 3. As the spreading degree of the light is increased, the orientation angle may be more widely spread, so that the optical power may be increased.

Figure 4:
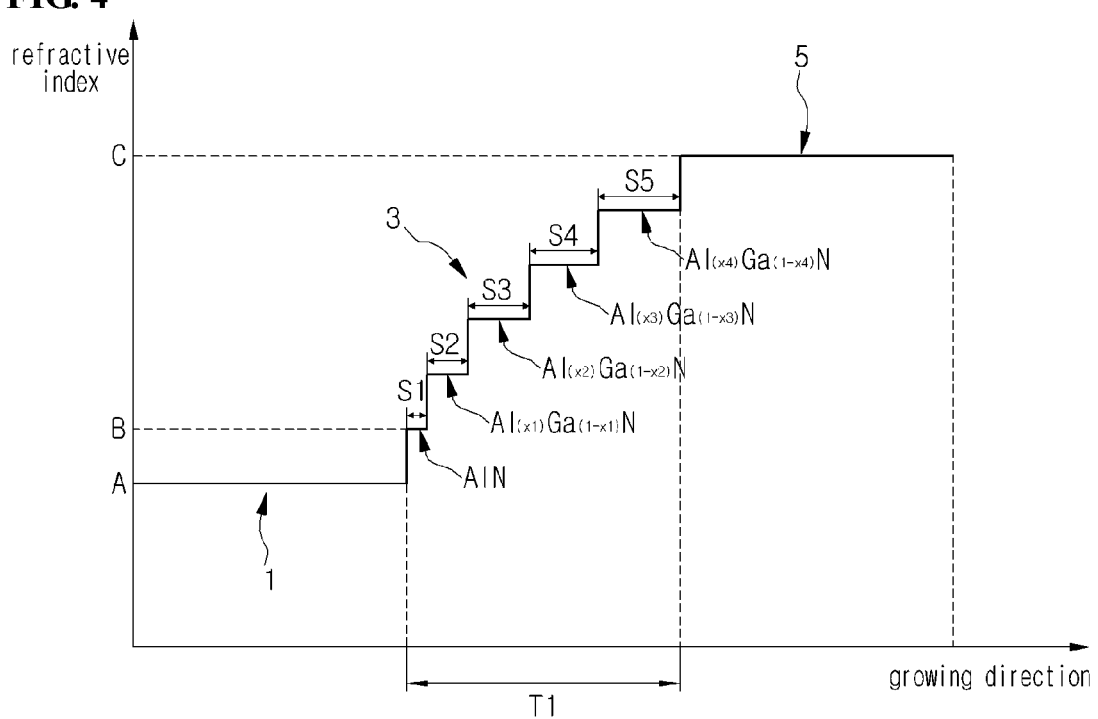
FIG. 4 is a graph showing a second example of the refractive index distribution of a buffer layer according to the first and second embodiments.

As shown in the second example of FIG. 4, the buffer layer 3 may include a plurality of sub-layers having refractive indexes different from each other.

Different from the first example shown in FIG. 3, the thicknesses S1 to S5 of the sub-layers may be varied in the second example of FIG. 4.

In other words, the thicknesses S1 to S5 of the sub-layers of the buffer layer 3 may be increased from the substrate 1 toward the first conductive semiconductor layer 5.

For instance, the thickness S2 of the second sub-layer may be greater than the thickness S1 of the first sub-layer, and the thickness S3 of the third sub-layer may be greater than the thickness S2 of the second sub-layer. The thickness S4 of the fourth sub-layer may be greater than the thickness S3 of the third sub-layer, and the thickness S5 of the fifth sub-layer may be greater than the thickness S4 of the fourth sub-layer.

In addition, the thickness S1 to S5 of each sub-layer may be linearly or non-linearly increased. The increasing rate of the thickness S1 to S5 of each sub-layer may be uniform or be varied depending on the sub-layers.

For example, the thickness S1 to S5 of each sub-layer may be uniformly increased at the rate of 5%, but the embodiment is not limited thereto.

Meanwhile, the thickness S1 to S5 of each sub-layer may be linearly or non-linearly increased. For instance, the thickness S2 of the second sub-layer may be increased by 1% of the thickness S1 of the first sub-layer, and the thickness S3 of the third sub-layer may be increased by 2% of the thickness S2 of the second sub-layer. The thickness S4 of the fourth sub-layer may be increased by 4% of the thickness S3 of the third sub-layer, and the thickness S5 of the fifth sub-layer may be increased by 8% of the thickness S4 of the fourth sub-layer, but the embodiment is not limited thereto.

In addition, for instance, the thickness S2 of the second sub-layer may be increased by 1% of the thickness S1 of the first sub-layer, and the thickness S3 of the third sub-layer may be increased by 3% of the thickness S2 of the second sub-layer. The thickness S4 of the fourth sub-layer may be increased by 8% of the thickness S3 of the third sub-layer, and the thickness S5 of the fifth sub-layer may be increased by 18% of the thickness S4 of the fourth sub-layer, but the embodiment is not limited thereto.

Even though the sub-layers have the thicknesses S1 to S5 different from each other as described above, since the sub-layers have refractive-indexes different from each other, the light generated from the active layer 7 and directed to the buffer layer 3 is output while being more widely spread through the boundary surfaces among the first to fifth sub-layers. Accordingly, the orientation angle of the output light may be more widely expanded.

Figure 5:
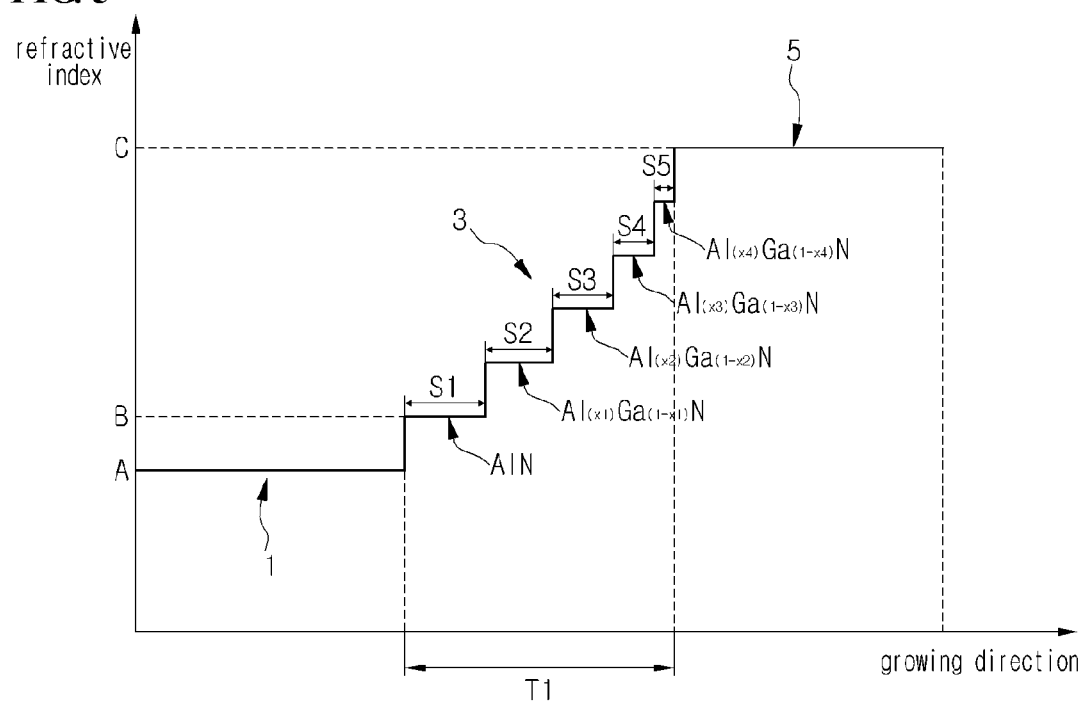
FIG. 5 is a graph showing a third example of the refractive index distribution of a buffer layer according to the first and second embodiments.

As shown in the third example of FIG. 5, the buffer layer 3 may include a plurality of sub-layers having refractive indexes different from each other.

Different from the first example shown in FIG. 3, the thicknesses S1 to S5 of the sub-layers may be varied in the third example of FIG. 5.

The third example of FIG. 5 is similar to the second example of FIG. 4.

However, different from the second example of FIG. 4, in the third example of FIG. 5, the thicknesses S1 to S5 of the sub-layers of the buffer layer 3 may be decreased from the substrate 1 toward the first conductive semiconductor layer 5.

For instance, the thickness S2 of the second sub-layer may be thinner than the thickness S1 of the first sub-layer, and the thickness S3 of the third sub-layer may be thinner than the thickness S2 of the second sub-layer. The thickness S4 of the fourth sub-layer may be thinner than the thickness S3 of the third sub-layer, and the thickness S5 of the fifth sub-layer may be thinner than the thickness S4 of the fourth sub-layer.

The decreasing rate of the thickness S1 to S5 of each sub-layer may be uniform or varied depending on the sub-layers.

In addition, the thickness S1 to S5 of each sub-layer may be linearly or non-linearly decreased.

Figure 6:
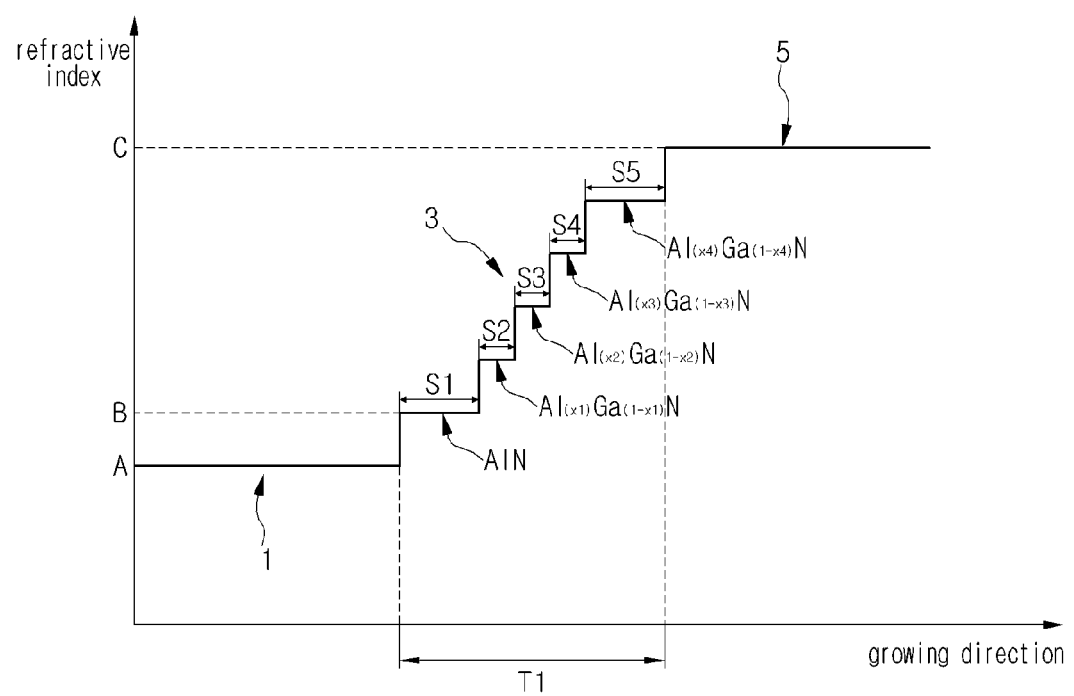
FIG. 6 is a graph showing a fourth example of the refractive index distribution of a buffer layer according to the first and second embodiments.

As shown in the fourth example of FIG. 6, the buffer layer 3 may include a plurality of sub-layers having refractive indexes different from each other.

Different from the first example shown in FIG. 3, the thicknesses S1 to S5 of the sub-layers may be varied in the fourth example of FIG. 6.

The fourth example of FIG. 6 is similar to the second example of FIG. 4 or the third example of FIG. 5.

However, different from the second example of FIG. 4, in the fourth example of FIG. 6, the thicknesses S1 to S5 of the sub-layers of the buffer layer 3 may be increased from the center (that is, third sub-layer) of the buffer layer 3 toward the substrate 1, or from the center of the buffer layer 3 toward the first conductive semiconductor layer 5. For example, among the first to fifth sub-layers included in the buffer layer 3, the third sub-layer may have the thinnest thickness S3.

The thickness S2 of the second sub-layer may be thicker than the thickness S3 of the third sub-layer, and the thickness S1 of the first sub-layer may be thicker than the thickness S2 of the second sub-layer. Similarly, the thickness S4 of the fourth sub-layer may be thicker than the thickness S3 of the third sub-layer, and the thickness S5 of the fifth sub-layer may be thicker than the thickness S4 of the fourth sub-layer.

The increasing rate of the thickness S1 to S5 of each sub-layer, which has a thickness increased toward the first sub-layer or the fifth sub-layer from the third sub-layer, may be uniform or varied depending on the sub-layers.

When viewed on the basis of the third sub-layer, the thicknesses S1 and S2 of the sub-layers between the third sub-layer and the substrate 1 may be symmetrical to the thicknesses S4 and S5 of the sub-layers between the third sub-layer and the first conductive semiconductor layer 5, but the embodiment is not limited thereto.

For example, the thickness S2 of the second sub-layer may be equal to the thickness S4 of the fourth sub-layer. In addition, the thickness S1 of the first sub-layer may be equal to the thickness S5 of the fifth sub-layer.

In addition, the thickness S1 to S5 of each sub-layer may be linearly or non-linearly increased.

Meanwhile, although not shown, different from the fourth example of FIG. 6, the thicknesses S1 to S5 of the sub-layers of the buffer layer 3 may be decreased from the center (that is, third sub-layer) of the buffer layer 3 toward the substrate 1, or from the center of the buffer layer 3 toward the first conductive semiconductor layer 5.

Figure 7:
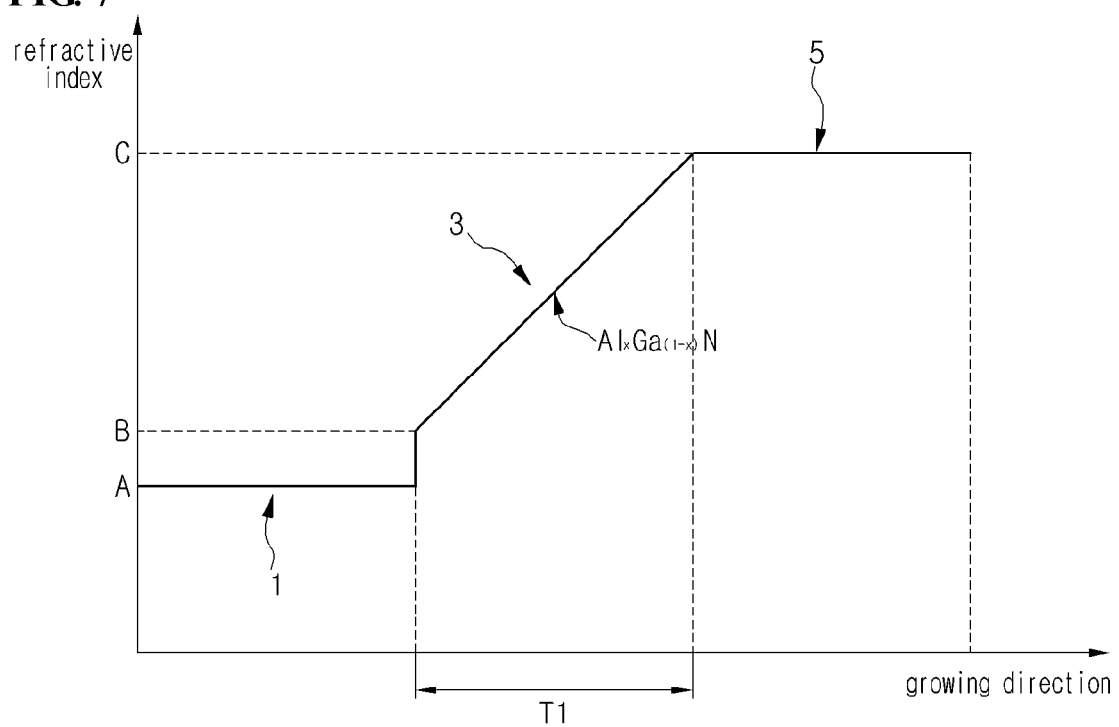
FIG. 7 is a graph showing a fifth example of the refractive index distribution of a buffer layer according to the first and second embodiments.

As shown in the fifth example of FIG. 7, the buffer layer 3 may have the refractive index that is linearly increased, but the embodiment is not limited thereto.

In other words, the buffer layer 3 may have the refractive index that is linearly increased from the substrate 1 toward the first conductive semiconductor layer 5.

A sub-layer of the buffer layer 3 adjacent to the substrate 1 may include AlN, and remaining sub-layers of the buffer layer 3 other than the sub-layer including AlN may include $Al_xGa_{(1-x)}N$ ($0 \leq x < 1$).

AlN is obtained when x=1 in $Al_xGa_{(1-x)}N$. Accordingly, the entire portion of the buffer layer 3 may include $Al_xGa_{(1-x)}N$.

Figure 8:
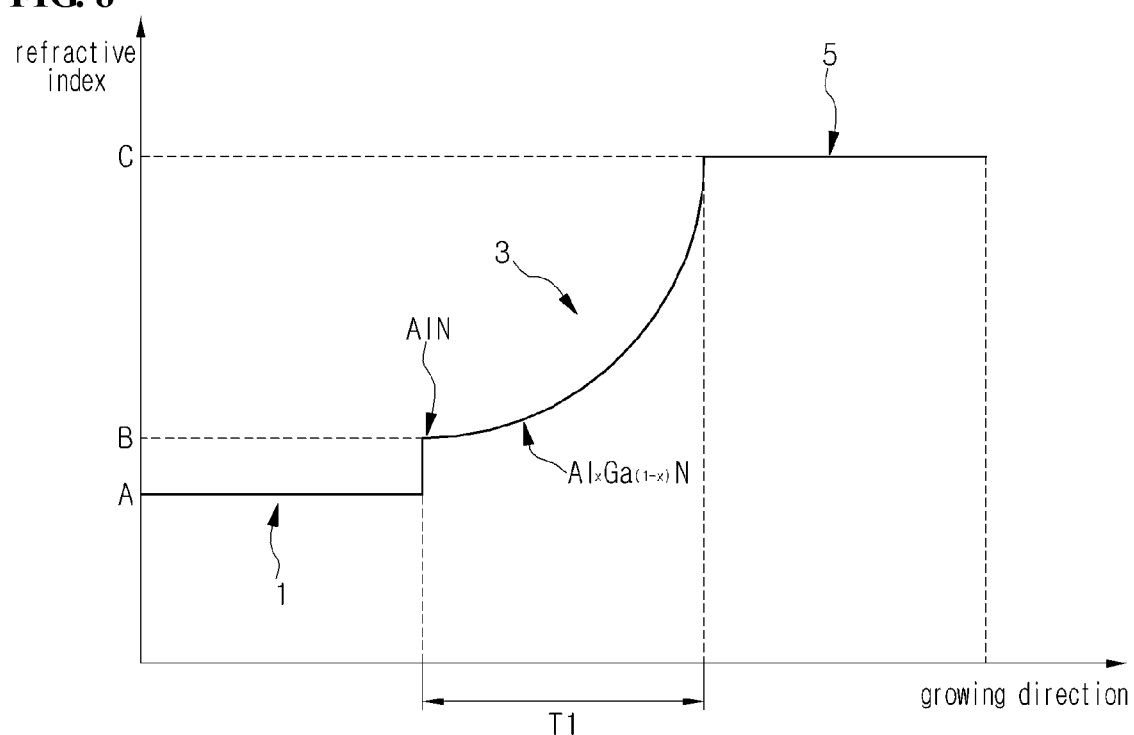
FIG. 8 is a graph showing a sixth example of the refractive index distribution of a buffer layer according to the first and second embodiments.

As shown in the sixth example of FIG. 8, the buffer layer 3 may have the refractive index that is non-linearly increased. In detail, the refractive index of the buffer layer 3 may be slowly increased from the substrate 1 to a portion corresponding to a half value (T½) of the thickness T1 of the buffer layer 3, and rapidly increased from the portion corresponding to the half value (T½) of the thickness T1 of the buffer layer 3 to the first conductive semiconductor layer 5. The refractive index of the buffer layer 3 may be increased while representing the shape of a concave curve line.

Figure 9:
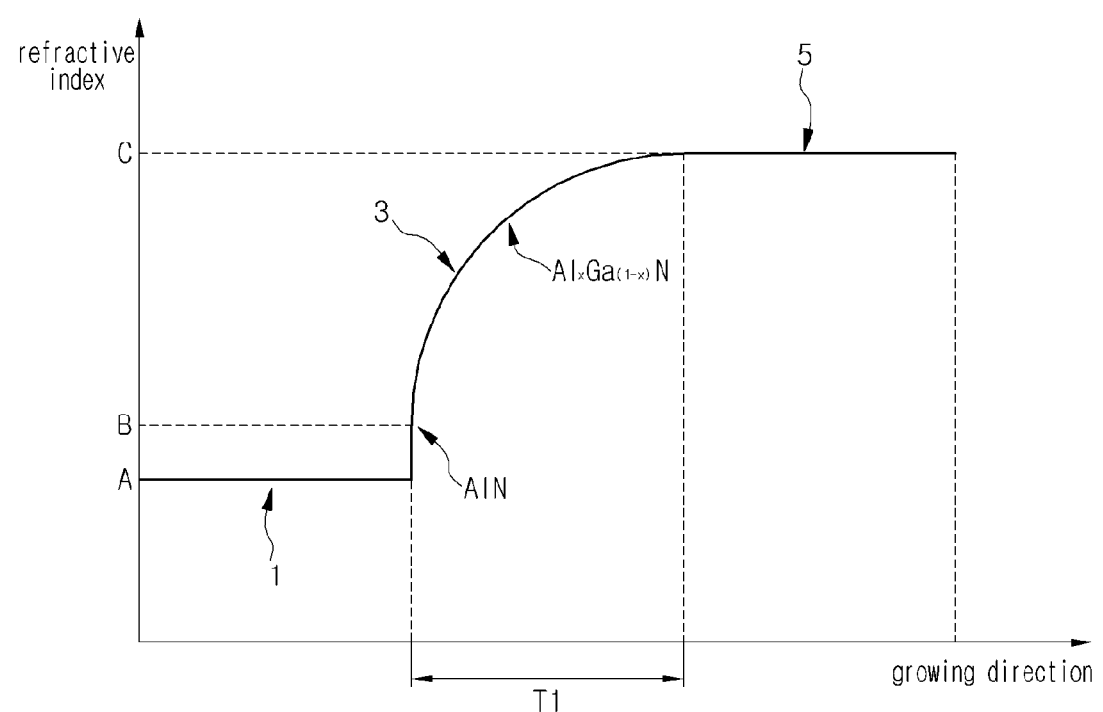
FIG. 9 is a graph showing a seventh example of the refractive index distribution of a buffer layer according to the first and second embodiments.

As shown in the seventh example of FIG. 9, the buffer layer 3 may have the refractive index that is non-linearly increased. In detail, the refractive index of the buffer layer 3 may be rapidly increased from the substrate 1 to the middle value (T½) of the thickness T1 of the buffer layer 3, and slowly increased from the middle value (T½) of the thickness T1 of the buffer layer 3 to the first conductive semiconductor layer 5. The refractive index of the buffer layer 3 may be increased while representing the shape of a convex curve line.

As described above, as shown in the first example of FIG. 3 to the seventh example of FIG. 9, the refractive index of the buffer layer 3 may be increased in a step type (see FIGS. 3 to 6), a linear type (see FIG. 7), and a non-linear type (see FIGS. 8 and 9), the shape of a concave curve line (see FIG. 8), and the shape of a convex curve line (see FIG. 9) from the substrate 1 toward the first conductive semiconductor layer 5. In this case, the light generated from the active layer 7 and directed toward the buffer layer 3 is output with the more expanded orientation angle, so that the optical power can be improved when the light emitting device 100A having the buffer layer 3 is applied to a light emitting device package.

Figure 2:
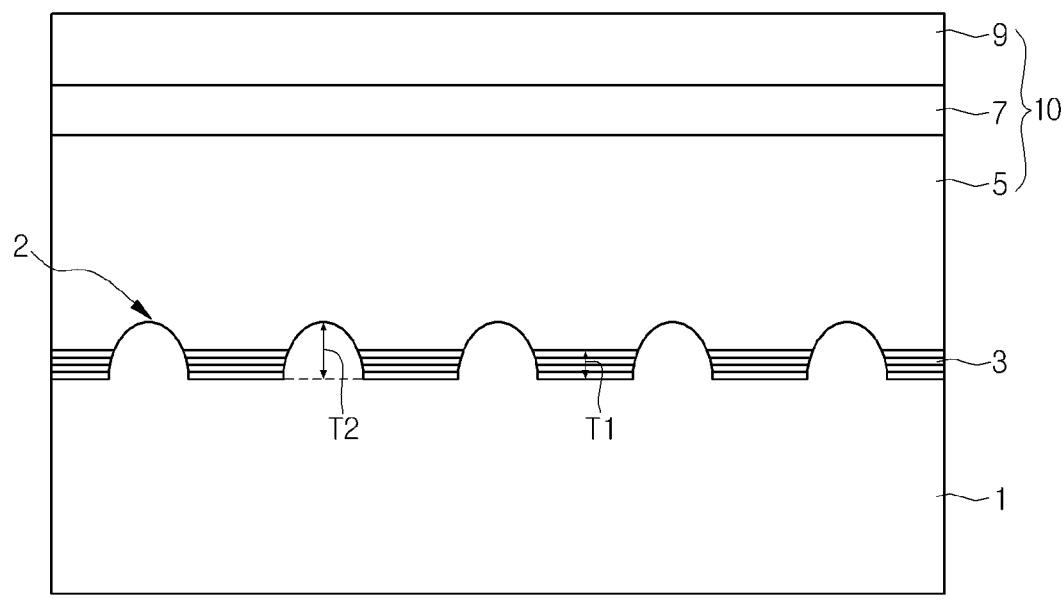
FIG. 2 is a sectional view showing a light emitting device according to a second embodiment.

FIG. 2 is a sectional view showing a light emitting device according to a second embodiment.

Different from the first embodiment (see FIG. 1), a light emitting device 100B according to the second embodiment (see FIG. 2) may have a plurality of protrusions 2 formed on the substrate 1. The protrusions 2 may have a hemispherical shape that is convexed upwardly, but the embodiment is not limited thereto. When viewed in a side direction, each protrusion 2 may have the shape of a rectangle, a circle, an oval, or a triangle that protrudes upward.

The protrusions 2 may have the shape of dots spaced apart from each other. The protrusions 2 may have the shape of a line stripe longitudinally formed in one direction. In addition, the protrusions 2 may have various shapes, but the embodiment is not limited thereto.

The protrusions 2 may extend upwardly from a top surface of the substrate 1. In this case, the protrusions 2 may include the same material as a material constituting the substrate 1, but the embodiment is not limited thereto. The protrusions 2 may be formed by partially or selectively the top surface of the substrate 1, but the embodiment is not limited thereto.

In addition, the protrusions 2 may be separately formed with the substrate 2. In other words, after previously processing the protrusions 2, the protrusions 2 may be attached to the substrate 2.

The protrusions 2 may extract a larger quantity of light by diffuse-reflecting the light generated from the active layer 7 and directed toward the substrate 1.

The protrusions 2 may be spaced apart from each other on the substrate 1.

The buffer layer 3 may be formed on the substrate 1 between the adjacent protrusions 2.

On the assumption that the thickness of the buffer layer 3 is T1, and the thickness of each protrusion 2 is T2, the thickness T1 of the buffer layer 3 may be thinner than the thickness T2 of the protrusion 2, but the embodiment is not limited thereto. Accordingly, the protrusion 2 projects out of a top surface of the buffer layer 3 and is exposed out of the top surface of the buffer layer 3.

The protrusion 2 may be covered by the first conductive semiconductor layer 5. In other words, the first conductive semiconductor layer 5 may be formed between the protrusion 2 and the buffer layer 3.

The buffer layer 3 may have various modified structures (see FIGS. 3 to 9), but the embodiment is not limited thereto.

The light directed toward the buffer layer 3 may be more widely spread as described in the first embodiment of FIG. 1.

A portion of light generated from the active layer 7 and directed toward the substrate 1 is randomly diffuse-reflected from the protrusions 2 formed on the substrate 1, so that the light extraction efficiency can be improved.

Another portion of the light generated from the active layer 7 and directed toward the substrate 1 is output while being more widely spread by the buffer layer 3 provided on the substrate 1 between the protrusions 2, so that the orientation angle of the light can be expanded.

Although not shown, the substrate 1 according to the first embodiment (see FIG. 1) and the second embodiment (see FIG. 2) is provided on a rear surface thereof with a reflective layer capable of reflecting the light which is directed while being more widely spread by the buffer layer 3, but the embodiment is not limited thereto.

If the light emitting devices 100A and 100B according to the first embodiment (see FIG. 1) and the second embodiment (see FIG. 2) are mounted on an electrode layer having a reflective characteristic, the reflective layer may not be formed on the rear surface of the substrate 1.

The first embodiment of FIG. 1 and the second embodiment of FIG. 2 may be applied to a lateral type light emitting device 200A, a flip type light emitting device 200B, and a vertical type light emitting device 200C.

Figure 11:
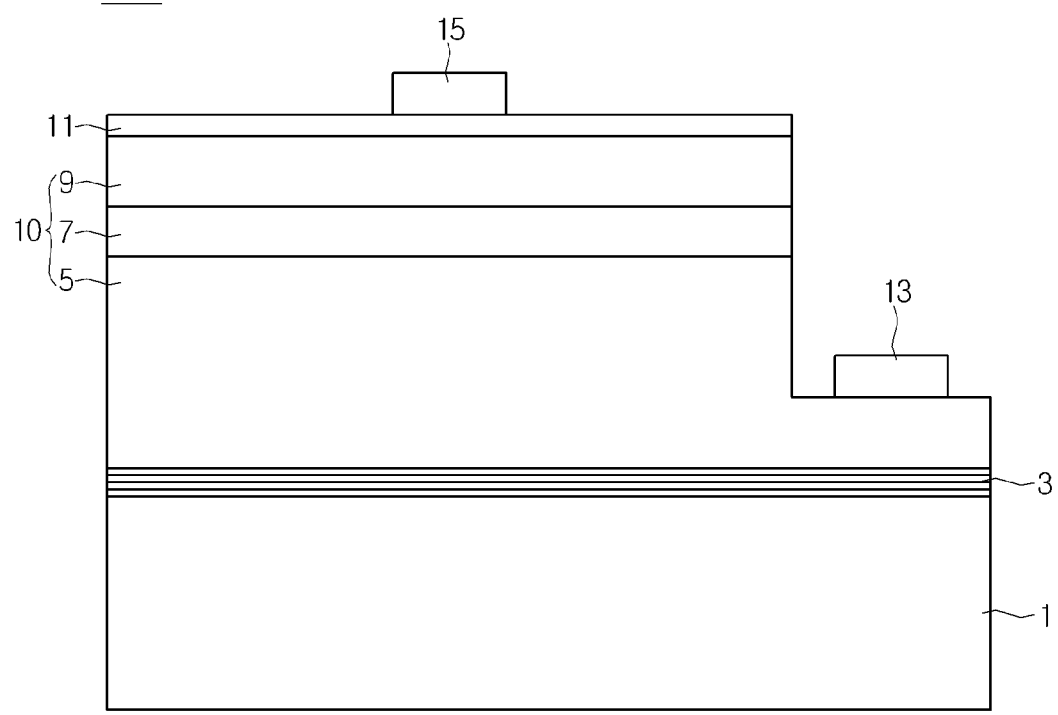
FIG. 11 is a sectional view showing a lateral type light emitting device according to the embodiment.

FIG. 11 is a sectional view showing the lateral type light emitting device 200A according to the embodiment.

Referring to FIG. 11, the lateral type light emitting device 200A according to the embodiment may include the substrate 1, the buffer layer 3, the light-emitting structure 10, a transparent electrode layer 11, and first and second electrodes 13 and 15.

Hereinafter, the details of the substrate 1, the buffer layer 3, and the light-emitting structure 10 will be omitted because the details thereof have been described in detail according to the first embodiment of FIG. 1 and the second embodiment of FIG. 2.

The light-emitting structure 10 may include the first conductive semiconductor layer 5, the active layer 7, and the second conductive semiconductor layer 9.

The first conductive semiconductor layer 5 may be formed on the buffer layer 3 that is formed on the substrate 1 like the first embodiment of FIG. 1, or formed between the protrusions 2 formed on the substrate 1 like the second embodiment of FIG. 2.

The active layer 7 may be formed on the first conductive semiconductor layer 5.

The second conductive semiconductor layer 9 may be formed on the active layer 7.

The first carriers (that is, electrons) produced in the first conductive semiconductor layer 5 may be supplied to the active layer 7, and the second carriers (that is, holes) produced in the second conductive semiconductor layer 9 may be supplied to the active layer 7.

The active layer 7 may generate light having the wavelength corresponding to the bandgap of the active layer 7 through the recombination of the electrons and the holes.

A portion of the light-emitting structure 10 may be removed through an etch process. In other words, the second conductive semiconductor layer 9 and the active layer 7 are removed through the etch process, so that the first conductive semiconductor layer 5 may be exposed.

A portion of a top surface of the first conductive semiconductor layer 5 may be removed through the etch process, but the embodiment is not limited thereto.

The first electrode 13 may be formed on the exposed first conductive semiconductor layer 5, and the second electrode 15 may be formed on the second conductive semiconductor layer 9.

The first and second electrodes 13 and 15 may include a metallic material representing superior conductivity. The metallic material may include one selected from the group consisting of Al, Ti, Cr, Ni, Pt, Au, W, Cu and Mo, or the stack structure thereof, but the embodiment is not limited thereto.

The metallic material constituting the second electrode 15 is opaque to block light. Accordingly, since light is blocked by the second electrode 15, the light efficiency may be degraded.

Accordingly, although the second electrode 15 preferably has a smaller area if possible, there is limitation in reducing the area of the second electrode 15.

Meanwhile, if the second electrode 15 has a small area, the current applied to the second electrode 15 may be applied to the active layer 7 through a portion of the second conductive semiconductor layer 9 corresponding to the second electrode 15. In other words, since the current applied to the second electrode 15 does not flow through the most portion of the second conductive semiconductor layer 9 other than the portion of the second conductive semiconductor layer 9 corresponding to the second electrode 15, holes are not sufficiently produced, so that the light efficiency may be degraded and uniform light may not be produced.

In order to overcome the above disadvantages, the transparent electrode layer 11 may be formed on the second conductive semiconductor layer 9.

The transparent electrode layer 11 makes ohmic contact with the second conductive semiconductor layer 9, so that the current applied to the second electrode 15 can smoothly flow through the second conductive semiconductor layer 9.

In addition, the transparent electrode layer 11 allows the current applied to the second electrode 15 to rapidly flow throughout the whole region of the transparent electrode layer 11. As described above, since the current flowing throughout the whole region of the transparent electrode layer 11 flows through the second conductive semiconductor layer 9 making contact with the whole region of the transparent electrode layer 11, current can be uniformly applied to the active layer 7 from the whole region of the second conductive semiconductor layer 9. Accordingly, uniform current can be obtained through the whole region of the active layer 7, so that the light efficiency can be improved.

The transparent electrode layer 11 may include a transparent conductive material allowing light to pass therethrough. The transparent conductive material may include at least one selected from the group consisting of ITO, IZO (InZnO), GZO (Ga—ZnO), AZO (Al—ZnO), AGZO (Al—Ga ZnO), IGZO (InGa ZnO), IrOx, RuOx, RuOx/ITO, Ni/IrOx/Au and Ni/IrOx/Au/ITO, but the embodiment is not limited thereto.

Figure 12:
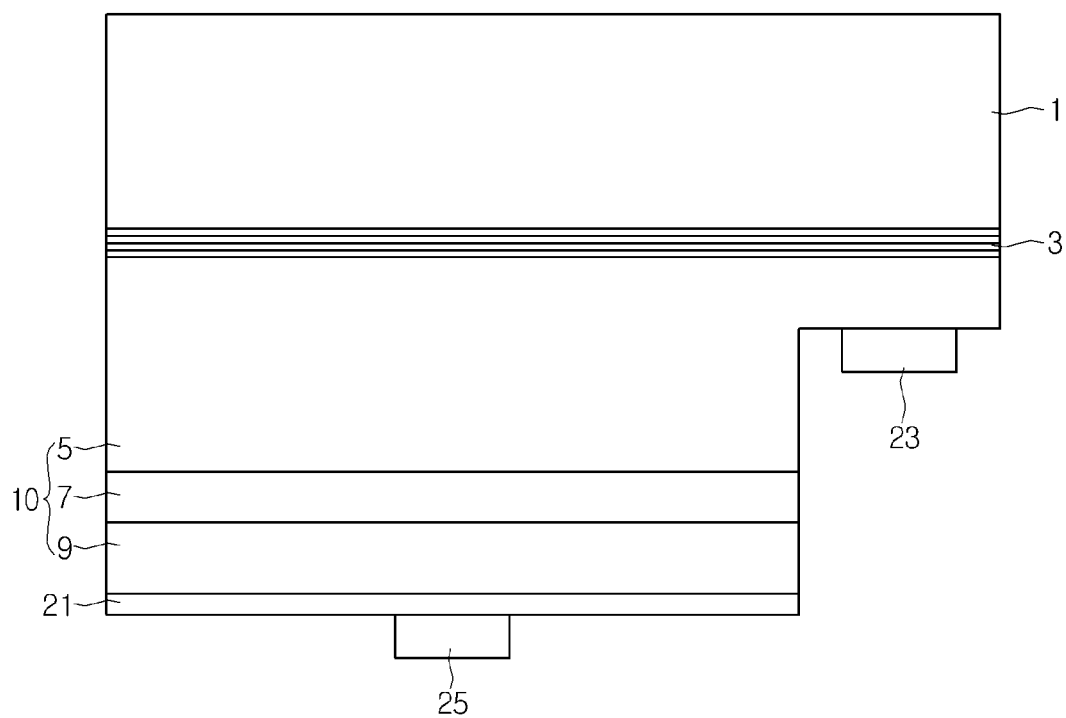
FIG. 12 is a sectional view showing a flip type light emitting device according to the embodiment.

FIG. 12 is a sectional view showing the flip type light emitting device 200B according to the embodiment.

Referring to FIG. 12, the flip type light emitting device 200B may include the substrate 1, the buffer layer 3, the light-emitting structure 10, a reflective electrode layer 21, and first and second electrodes 23 and 25.

The flip type light emitting device 200B is substantially similar to the lateral type light emitting device according to the embodiment 200A. In other words, the flip type light emitting device 200B according to the embodiment can be fabricated by substituting the transparent electrode layer 11, which is interposed between the second conductive semiconductor layer 9 and the second electrode 15, with the reflective electrode layer 21 and by reversing the lateral type light emitting device 200A at an angle of 180 degrees.

Hereinafter, the details of the substrate 1, the buffer layer 3, the light-emitting structure 10, and the first and second electrodes 23 and 25 will be omitted because the details thereof have been described in detail in the lateral type light emitting device 200A.

The reflective electrode layer 21 may be formed on the second conductive semiconductor layer 9. The reflective electrode layer 21 may have a reflection function to reflect light, an ohmic contact function to smoothly supply current to the second conductive semiconductor layer 9, and an electrode function to supply the current to the second conductive semiconductor layer 9, but the embodiment is not limited thereto.

The reflective electrode layer 21 may include a conductive material representing a superior reflective characteristic and a superior ohmic characteristic. For example, the reflective electrode layer 21 may include one selected from the group consisting of Ag, Ni, Rh, Pd, Ru, Pt and Au or the stack structure thereof, but the embodiment is not limited thereto.

Figure 13:
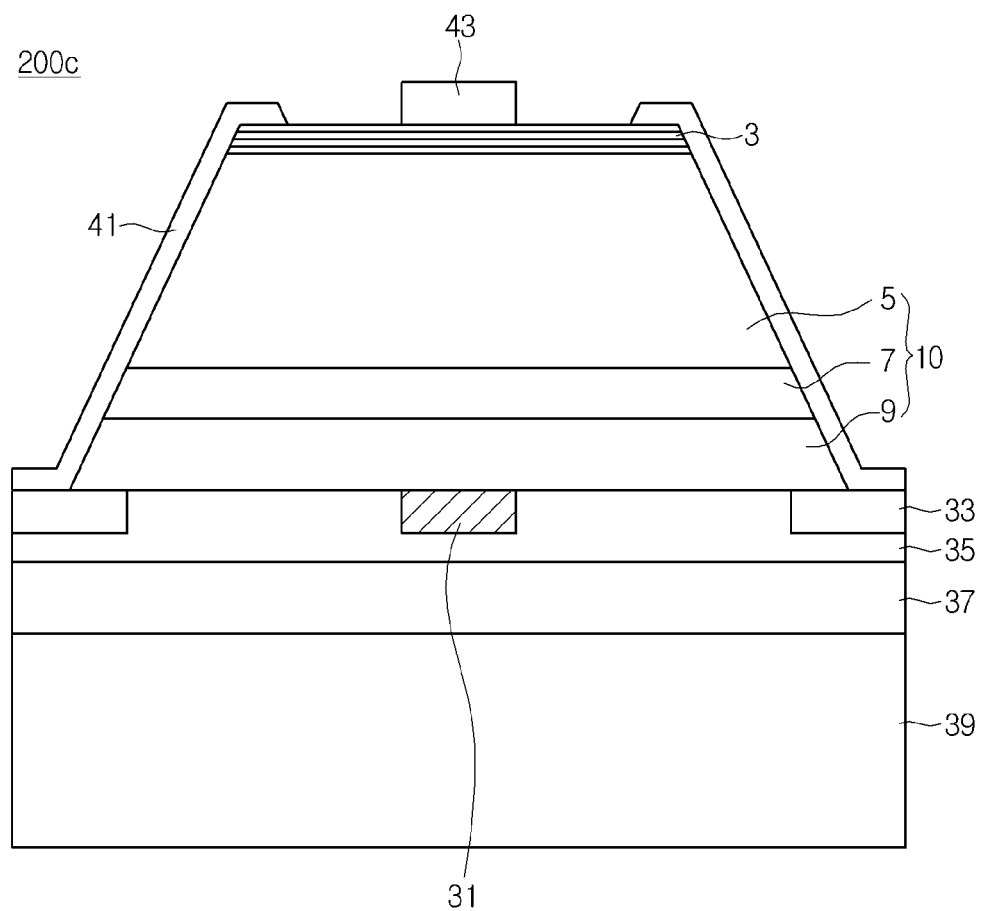
FIG. 13 is a sectional view showing a vertical type light emitting device according to the embodiment.

FIG. 13 is a sectional view showing the vertical type light emitting device 200C according to the embodiment.

Referring to FIG. 13, the vertical type light emitting device 200C according to the embodiment may include the buffer layer 3, the light-emitting structure 10, a current blocking layer 31, an electrode layer 35, a first protective layer 33, an adhesive layer 37, a conductive support member 39, a second protective layer 41, and an electrode 43.

The vertical type light emitting device 200C according to the embodiment may be fabricated based on the light emitting device 100A according to the first embodiment of FIG. 1 and the light emitting device 100B according to the second embodiment of FIG. 2.

Accordingly, since the buffer layer 3 and the light-emitting structure 10 have been described in detail in the first embodiment of FIG. 1 and the second embodiment of FIG. 2, the details thereof will be omitted below.

The current blocking layer 31 may overlap with at least a portion of the electrode 43 in order to prevent current from being concentrated in a vertical direction.

The current blocking layer 31 may make schottky contact with the light-emitting structure 10. Accordingly, current may not fully flow to the light-emitting structure 10, which makes schottky contact with the current blocking layer 31, through the current blocking layer 21, or a small quantity of current may flow through the current blocking layer 31. On the contrary, since current fully flows through the electrode layer 35 making contact with the second conductive semiconductor layer 9, the current uniformly flows throughout the whole region of the light-emitting structure 10, so that the light emission efficiency can be improved.

The current blocking layer 31 may include a material having electrical conductivity less than that constituting the electrode layer 35, having an electrical insulating property greater than that constituting the electrode layer 35, or making schottky contact with the light-emitting structure 10. For example, the current blocking layer 31 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al and Cr. In this case, the $SiO_2$, $SiO_x$, $SiO_xN_y$, $Si_3N_4$, $Al_2O_3$ may be insulating materials.

The electrode layer 35 may be formed under the second conductive semiconductor layer 9 of the light-emitting structure 10.

The electrode layer 35 reflects light incident from the light-emitting structure 10, so that the light extraction efficiency can be improved.

The electrode layer 35 makes ohmic contact with the light-emitting structure 10, so that current can flow through the light-emitting structure 10.

The electrode layer 35 may include a reflective layer making contact with a top surface of the adhesive layer 37 and an ohmic contact layer interposed between the top surface of the reflective layer and the bottom surface of the light-emitting structure 10.

The electrode layer 35 may include a single layer including the mixture of the reflective material and the ohmic contact material.

The reflective material includes at least one selected from the group consisting of Ag, Ni, Al, Rh, Pd, Ir, Ru, Mg, Zn, Pt, Au and Hf, or the alloy of at least two of the above materials, but the embodiment is not limited thereto. The ohmic contact material may include a conductive material or a metallic material. In other words, the ohmic contact material may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

For example, the electrode layer 35 may have a multiple-layer structure including one of IZO/Ni, AZO/Ag, IZO/Ag/Ni and AZO/Ag/Ni.

The electrode layer 35 may make ohmic contact with at least the light-emitting structure 10. Accordingly, current can be smoothly supplied to the light-emitting structure 10 making ohmic contact with the electrode layer 35, so that the light emission efficiency can be improved.

The adhesive layer 35 may be formed under the electrode layer 35. The adhesive layer 37 serves as a bonding layer, and may be interposed between the electrode layer 35 and the conductive support member 39. The adhesive layer 37 may serve as a medium to enhance the adhesive strength between the electrode layer 35 and the conductive support member 39.

The adhesive layer 37 may include barrier metal or bonding metal. The adhesive layer 37 may include a metallic material representing a high adhesive property and high thermal conductivity. The adhesive layer 37 may include at least one selected from the group consisting of titanium (Ti), gold (Au), sternum (Sn), nickel (Ni), niobium (Nb), chrome (Cr), gallium (Ga), indium (In), bismuth (Bi), copper (Cu), silver (Ag), and tantalum (Ta).

The conductive support member 39 may include a metallic material or a semiconductor material. The conductive support member 39 may include a material representing high electrical conductivity and high thermal conductivity. For instance, the conductive support member 39 may include at least one of titanium (Ti), chrome (Cr), nickel (Ni), aluminum (Al), platinum (Pt), gold (Au), tungsten (W), copper (Cu), copper alloy (Cu Alloy), molybdenum (Mo), and copper-tungsten (Cu—W).

The conductive support member 39 may be formed under the light-emitting structure 10 through a plating process and/or a deposition process, or may be attached to the light-emitting structure 10 in the form of a sheet, but the embodiment is not limited thereto.

The first protective layer 33 may be formed on the electrode layer 35. For example, the first protective layer 33 may be formed along an edge region of the electrode layer 35. The first protective layer 33 may be formed along a circumferential region between the light-emitting structure 10 and the electrode layer 35. In detail, at least a portion of the first protective layer 33 may be surrounded between the electrode layer 35 and the light-emitting structure 10. For example, a portion of a top surface of the first protective layer 33 makes contact with the first conductive semiconductor layer 5, and an inner lateral side and a bottom surface of the first protective layer 33 may make contact with the electrode layer 35, but the embodiment is not limited thereto.

The electrical short between a lateral side of the electrode layer 35 and a lateral side of the light-emitting structure 10 caused by external foreign matters can be prevented due to the first protective layer 33.

The contact area between the first protective layer 33 and the light-emitting structure 10 can be ensured, thereby effectively preventing the light-emitting structure 10 from being delaminated from the electrode layer 35 in a laser scribing process to divide a plurality of chips in the unit of an individual chip and a laser lift off (LLO) process to remove the substrate 1.

The first protective layer 33 may include an insulating material. The first protective layer 33 may include at least one selected from the group consisting of $SiO_2$, $SiO_x$, $SiO_xN_y$, $Si_3N_4$, and $Al_2O_3$. In addition, the first protective layer 33 may include a metallic material, but the embodiment is not limited thereto.

The first protective layer 33 may include the same material as that constituting the current blocking layer 31, or may include a material different from that constituting the current blocking layer 31. In other words, the first protective layer 33 and the current blocking layer 31 may include the insulating material.

The second protective layer 41 may be formed on the light-emitting structure 10. For example, the second protective layer 41 may be formed on at least the lateral side of the light-emitting structure 10. In detail, one end of the second protective layer 41 may be formed at a circumferential region of a top surface of the second conductive semiconductor layer 9, and an opposite end of the second protective layer 41 may be formed at a portion of the top surface of the first protective layer 33 while extending along a lateral side of the second conductive semiconductor layer 9, a lateral side of the active layer 7, and a lateral side of the first conductive semiconductor layer 5, but the embodiment is not limited thereto.

The second protective layer 41 may prevent the electrical short between the light-emitting structure 10 and the support substrate 1. The second protective layer 41 may include a material representing transparency and an insulating property. For example, the first protective layer 33 may include one selected from the group consisting of SiO2, SiOx, SiOxNy, Si3N4, TiO2, and Al2O3, but the embodiment is not limited thereto.

The second protective layer 41 may include a material the same as materials constituting the first protective layer 33 and the current blocking layer 31, but the embodiment is not limited thereto.

The electrode 43 may be formed on the light-emitting structure 10. The electrode 43 does not cover the entire area of the light-emitting structure 10, but may have the shape of a pattern that is locally formed on the light-emitting structure 10.

Although not shown, the electrode 43 may include at least one electrode pad (not shown) having a wire bonded thereto, and a plurality of electrode lines (not shown) branching from the electrode pad to at least one side so that current is uniformly supplied throughout the whole region of the light-emitting structure 10.

When viewed from the top, the electrode pad may have the shape of a rectangle, a circle, an oval, or a polygon, but the embodiment is not limited thereto.

The electrode 43 may have a single layer structure or a multi-layer structure including at least one selected from the group consisting of V, W, Au, Ti, Ni, Pd, Ru, Cu, Al, Cr, Ag and Pt.

Meanwhile, the electrode line may include a material having transparency and electrical conductivity. For example, the electrode line may include at least one of ITO, IZO, IZTO, IAZO, IGZO, IGTO, AZO, ATO, and ZnO.

Figure 14:
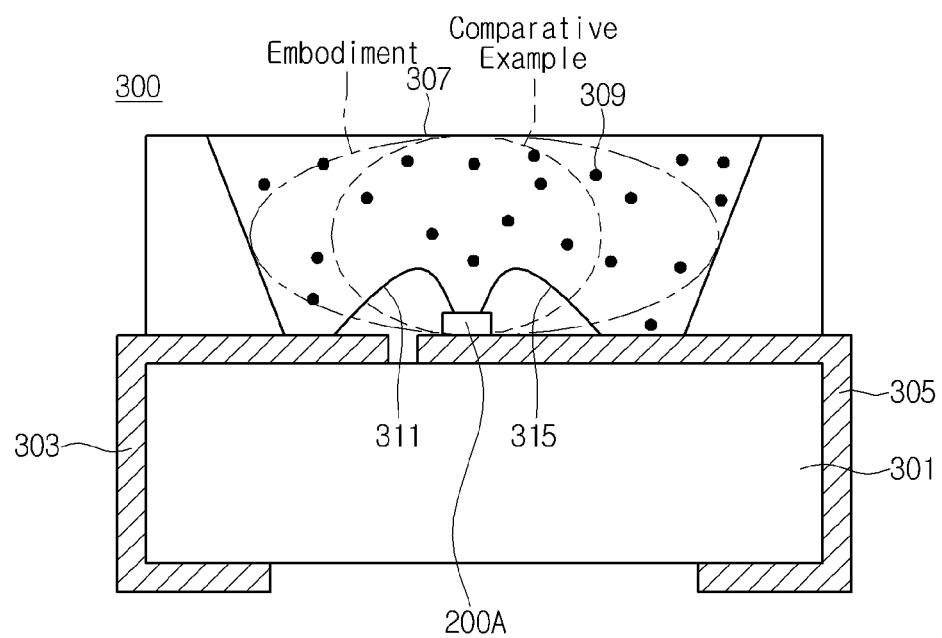
FIG. 14 is a sectional view showing a light emitting device package according to the embodiment.

FIG. 14 is a sectional view showing a light emitting device package 300 according to the embodiment.

Referring to FIG. 14, the emitting device package 300 according to the embodiment includes a package body 301, first and second lead electrodes 303 and 305 installed in the package body 301, one of the lateral type light emitting device 200A, the flip type light emitting device 200B, and the vertical type light emitting device 200C installed in the package body 301 to receive power from the first and second lead electrodes 303 and 305, and a molding member 307 surrounding the light emitting devices 200A, 200B, and 200C.

Although FIG. 14 shows only the lateral type light emitting device 200A for the convenience of explanation, the light emitting device package 300 according to the embodiment may include the flip type light emitting device 200B or the vertical type light emitting device 200C.

The package body 301 may include silicon, synthetic resin, or metal, and inclined surfaces may be formed around the light emitting devices 200A, 200B, and 200C.

The first and second lead electrodes 303 and 305 are electrically insulated from each other, and supply power to the light emitting device 200A, 200B, or 200C.

In addition, the first and second lead electrodes 303 and 305 may reflect light generated from the light emitting device 200A, 200B, or 200C to increase light efficiency, and may discharge heat emitted from the light emitting device 200A, 200B, or 200C to the outside.

The light emitting device 200A, 200B, or 200C may be installed in one of the first lead electrode 303, the second lead electrode 305, and the package body 301, and may be electrically connected to the first and second lead electrodes 303 and 305 through a wire scheme, or a die bonding scheme, but the embodiment is not limited thereto.

According to the embodiment, for the illustrative purpose, the lateral type light emitting device 200A is prepared, and electrically connected to the first and second lead electrodes 303 and 305 through two wires 311 and 315.

If the flip type light emitting device 200B is employed, the wires 311 and 315 are not required, and the first and second electrodes 23 and 25 of the flip type light emitting device 200B may directly make contact with the first and second lead electrodes 303 and 305. If the vertical light emitting device 200C is employed, the conductive support member 39 of the vertical type light emitting device 200C may be installed on the second lead electrode 305, and the electrode 43 of the vertical type light emitting device 200C may be electrically connected to the first electrode 303 by using the wire 311.

The molding member 307 may surround the light emitting device 200A, 200B, or 200C to protect the light emitting device 200A, 200B, or 200C.

Meanwhile, the molding member 307 may include a phosphorous body that may change the wavelength of the light generated from the light emitting device 200A, 200B, or 200C, but the embodiment is not limited thereto.

The light emitting device package 300 according to the embodiment includes a COB light emitting device package, and the package body 301 has a flat top surface. The package body 301 may be provided thereon with a plurality of light emitting devices such as red, green, and blue light emitting devices, but the embodiment is not limited thereto.

Since the light emitting device package 300 according to the embodiment includes the lateral type light emitting device 200A, the flip type light emitting device 200B, or the vertical type light emitting device 200C having the expanded orientation angle, the optical power can be improved, but the embodiment is not limited thereto.

Meanwhile, as shown in FIG. 14, according to the light emitting device package of the embodiment, as the light emitting device 200A, 200B, or 200C including the buffer layer capable of increasing the spreading of the light is employed, the light extraction can be improved due to the spreading of the light, so that the orientation angle can be remarkably expanded as compared with a comparative example.

According to the embodiment, in the light emitting device including the substrate, the buffer layer, and the light-emitting structure, the refractive index of the buffer layer is reduced toward the substrate from the light-emitting structure, so that the orientation angle of the light can be expanded. As described above, the light emitting device having the expanded orientation angle of light is applied to the light emitting device package, so that the optical power of the light emitting device package can be increased.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
a buffer layer on the substrate; and
a light-emitting structure on the buffer layer,
wherein the buffer layer has a refractive index decreased toward the substrate from the light-emitting structure,
wherein the buffer layer includes a plurality of sub-layers,
wherein the plurality of sub-layers include a first layer, a second layer disposed under the first layer, and a third layer disposed under the second layer,
wherein a refractive index of the first layer is greater than a refractive index of the second layer, and
wherein the refractive index of the second layer is greater than a refractive index of the third layer.

2. The light emitting device of claim 1, wherein the refractive index of each sub-layer is decreased toward the substrate from the light-emitting structure.

3. The light emitting device of claim 1, wherein an Al content of each sub-layer is decreased toward the substrate from the light-emitting structure.

4. The light emitting device of claim 1, wherein each sub-layer includes a compound semiconductor material having a refractive index smaller than a refractive index of the light-emitting structure and greater than a refractive index of the substrate.

5. The light emitting device of claim 4, wherein the sub-layer includes $Al_xGa_{(1-x)}N$ in which $0 \leq x \leq 1$.

6. The light emitting device of claim 4, wherein the sub-layer includes $Al_xGa_{(1-x)}N$ in which $0 < x \leq 1$.

7. The light emitting device of claim 1, wherein the sub-layers have Al contents different from each other.

8. The light emitting device of claim 1, wherein a difference in the refractive index between individual sub-layers is variable.

9. The light emitting device of claim 1, wherein a thickness of each sub-layer is variable.

10. The light emitting device of claim 1, wherein variation in the refractive index of the buffer layer from the light-emitting structure to a portion corresponding to a half of a thickness of the buffer layer is greater than variation in the refractive index of the buffer layer from the portion corresponding to the half of the thickness of the buffer layer to the substrate.

11. The light emitting device of claim 1, wherein variation in the refractive index of the buffer layer from the light-emitting structure to a portion corresponding to a half of a thickness of the buffer layer is smaller than variation in the refractive index of the buffer layer from the portion corresponding to the half of the thickness of the buffer layer to the substrate.

12. The light emitting device of claim 1, further comprising a plurality of protrusions on the substrate.

13. The light emitting device of claim 12, wherein the buffer layer is disposed on the substrate between the protrusions.

14. The light emitting device of claim 12, wherein each protrusion extends upwardly from a top surface of the substrate.

15. The light emitting device of claim 1, wherein the first layer includes a GaN layer, the second layer includes an AlGaN layer, and the third layer includes an AlN layer.

16. The light emitting device of claim 1, wherein the refractive index of the third layer is greater than a refractive index of the substrate.

17. The light emitting device of claim 1, wherein the substrate includes a sapphire substrate.

18. A light emitting device comprising:
a substrate;
a buffer layer on the substrate, the buffer layer including a first layer, a second layer under the first layer, and a third layer under the second layer;
a first conductive semiconductor layer on the buffer layer;
an active layer on the first conductive semiconductor layer;
a second conductive semiconductor layer on the active layer;
a first electrode disposed on the first conductive semiconductor layer; and
a second electrode disposed on the second conductive semiconductor layer,
wherein a refractive index of the first layer is greater than a refractive index of the second layer, and wherein the refractive index of the second layer is greater than a refractive index of the third layer.

19. The light emitting device of claim 18, wherein the refractive index of the third layer is greater than a refractive index of the substrate.

20. The light emitting device of claim 18, wherein the first layer includes a GaN layer, the second layer includes an AlGaN layer, the third layer includes an AlN layer, and the substrate includes a sapphire substrate.

* * * * *